United States Patent
Droes et al.

(10) Patent No.: US 7,179,719 B2
(45) Date of Patent: Feb. 20, 2007

(54) SYSTEM AND METHOD FOR HYDROGEN EXFOLIATION

(75) Inventors: Steve Droes, Camas, WA (US); Masao Moriguchi, Vancouver, WA (US); Yutaka Takafuji, Nara (JP)

(73) Assignee: Sharp Laboratories of America, Inc., Camas, WA (US)

( * ) Notice: Subject to any disclaimer, the term of this patent is extended or adjusted under 35 U.S.C. 154(b) by 206 days.

(21) Appl. No.: 10/953,938

(22) Filed: Sep. 28, 2004

(65) Prior Publication Data

US 2006/0068565 A1    Mar. 30, 2006

(51) Int. Cl.
*H01L 21/46* (2006.01)
*H01L 21/30* (2006.01)

(52) U.S. Cl. .............................. 438/458; 257/E21.567
(58) Field of Classification Search ................ 438/458; 257/E21.567

See application file for complete search history.

(56) References Cited

U.S. PATENT DOCUMENTS

| | | | | |
|---|---|---|---|---|
| 6,159,323 | A | 12/2000 | Joly et al. | 156/241 |
| 6,187,110 | B1* | 2/2001 | Henley et al. | 148/33.2 |
| 6,316,333 | B1 | 11/2001 | Bruel et al. | 438/458 |
| 6,350,703 | B1* | 2/2002 | Sakaguchi et al. | 438/766 |
| 6,544,862 | B1* | 4/2003 | Bryan | 438/455 |

OTHER PUBLICATIONS

Q.-Y. Tong and U. Gosele, "Semiconductor wafer bonding", John Wiley & Sons, New York. 1999.
M. Cai, D. Qiao, L.S. Yu and S.S. Lau, Single crystal Si layers on glass formed by ion cutting, *Journal of Applied Physics*, vol. 92, No. 6, Sep. 15, 2002, p. 3388-3392.
C.H. Yun, A.B. Wengrow and N.W. Cheung, "Transfer of patterned ion-cut silicon layers", *Applied Physics Letters*, vol. 73, No. 19, Nov. 9, 1998, pp. 2772-2774.
M.K. Weldon et al, "On the mechanism of the hydrogen-induced exfoliation of silicon", *Journal of Vacuum science and Technology B*. vol. 15, No. 4 Jul./Aug. 1997 pp. 1065-1073.

* cited by examiner

*Primary Examiner*—Asok Kumar Sarkar
(74) *Attorney, Agent, or Firm*—Law Office of Gerald Maliszewski; Gerald Maliszewski

(57) ABSTRACT

A system and method for hydrogen (H) exfoliation are provided for attaching silicon-on-insulator (SOI) fabricated circuits to carrier substrates. The method comprises: providing a SOI substrate, including a silicon (Si) active layer and buried oxide (BOX) layer overlying a Si substrate; forming a circuit in the Si active layer; forming a blocking mask over selected circuit areas; implanting H in the Si substrate; annealing; removing the blocking mask; in response to the H implanting, forming a cleaving plane in the Si substrate; bonding the circuit the top oxide layer to the carrier substrate; and, cleaving the Si substrate. More specifically, the cleaving plane is formed along a horizontal peak concentration (Rp) H layer in the Si substrate and along the buried oxide layer interface.

17 Claims, 6 Drawing Sheets

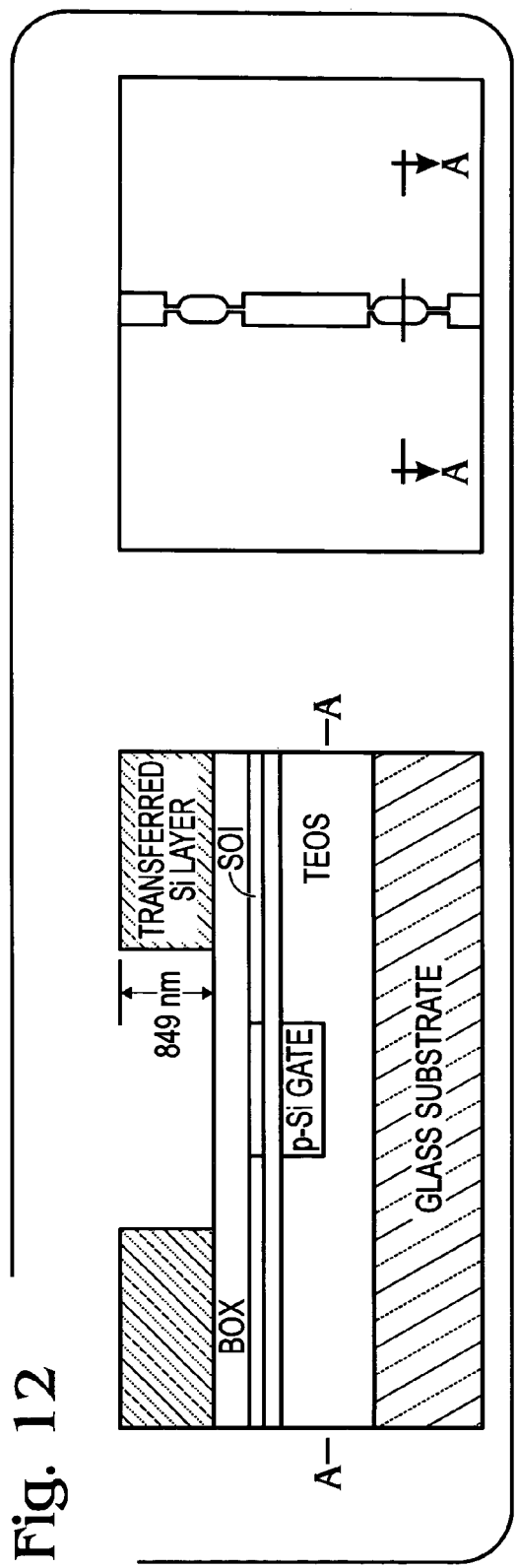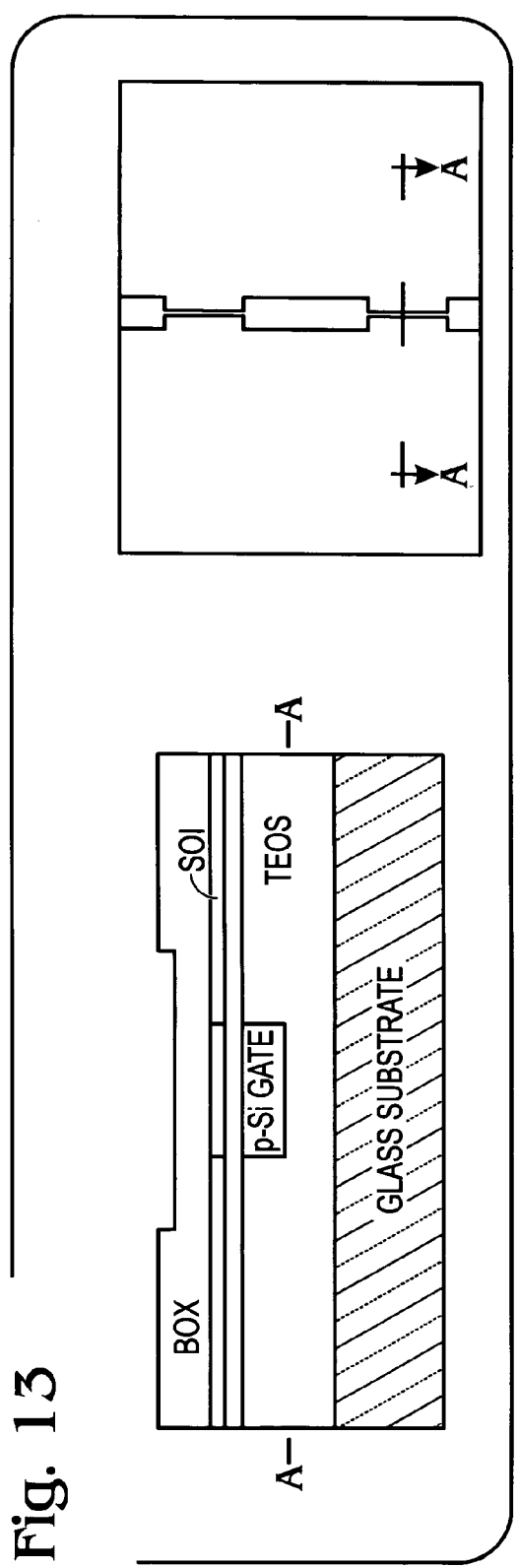
Fig. 12
Fig. 13

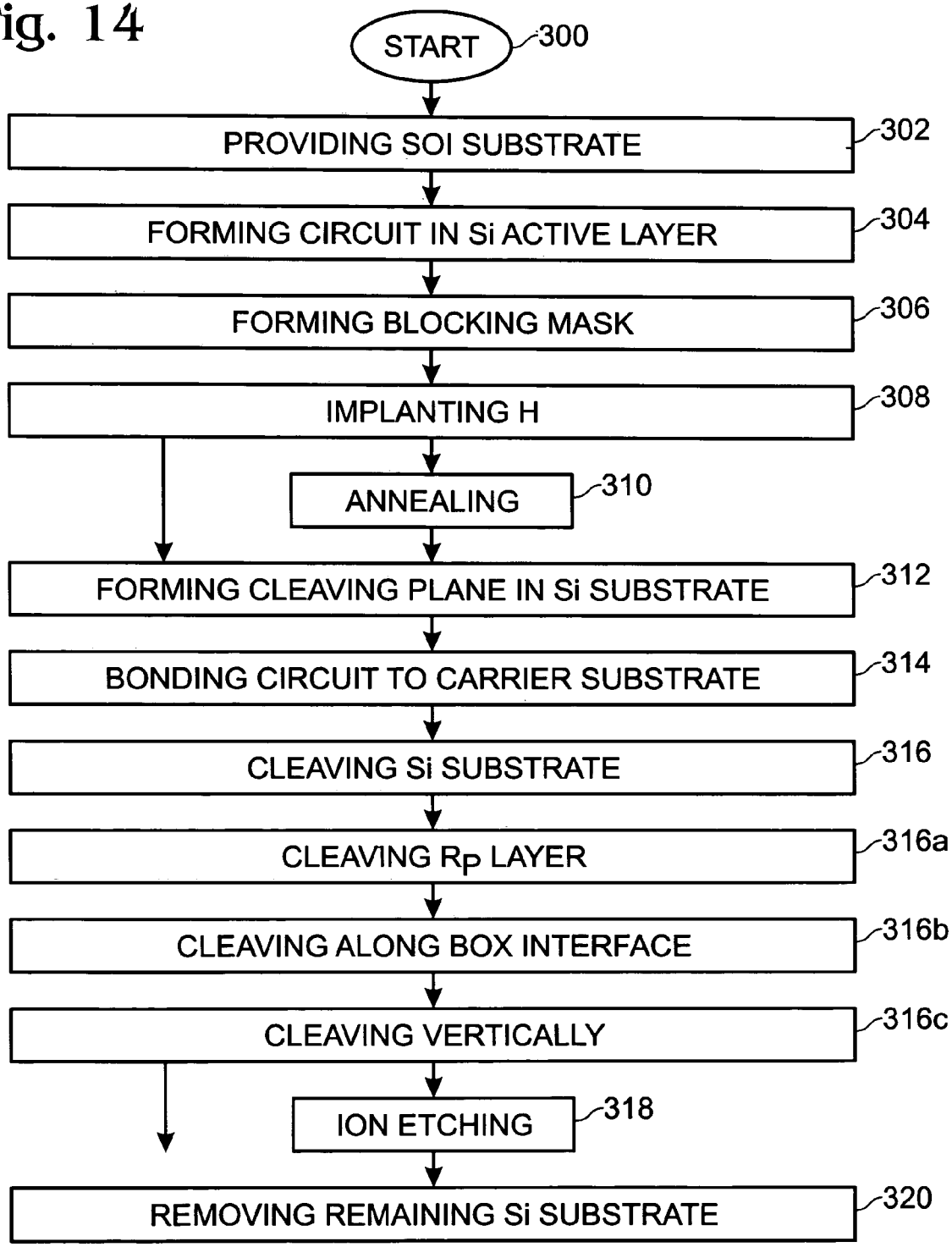

SYSTEM AND METHOD FOR HYDROGEN EXFOLIATION

BACKGROUND OF THE INVENTION

1. Field of the Invention

This invention generally relates to integrated circuit (IC) and liquid crystal display (LCD) fabrication and, more particularly, to a method for the transfer of partially completed very-large-scale integration (VLSI) circuits from single crystal silicon substrates to glass panels, for the production of flat panel displays.

2. Description of the Related Art

There is broad agreement in the flat panel display (FPD) industry that system-on-glass (SOG) technology is a natural evolutionary step for flat panel displays, especially for mobile devices. In fact, SOG is a natural confluence of display and microprocessor evolution because integration is a proven solution for greatly reducing costs, while improving the compactness and reliability of electrical systems.

Display modules have received some enhanced functionality, like display drivers and analog-to-digital converters, thanks to low-temperature polysilicon (LTPS) technology. Conventionally, the best means for achieving adequate LTPS performance for SOG devices at a competitive cost is the crystallization of a thin amorphous layer of silicon with a laser beam. Unfortunately, this approach remains relatively expensive, even years after being introduced to LCD production. Moreover, even if polysilicon thin film transistors (TFTs) could be efficiently produced using this method, it is unlikely that they will have sufficient capability to realize some sophisticated functions like CPU operations and digital signal processing. Finally, the steadiness of drive currents produced by poly-Si TFTs may be inadequate for new technologies such organic electroluminescent displays.

In short, the convolution between cost and performance of polysilicon devices still pales compared to that of single-crystal silicon (c-Si). The trouble is in creating quality thin films of c-Si on transparent or flexible substrates, which usually are made of materials other than silicon. Other solutions to this hybrid field problem include Fluidic-Self-Assembly™ (FSA) by Alien Technology. FSA works fairly well for plastic substrates and semiconductor blocks thicker than 50 microns. Unfortunately, FSA placement depends on random probability and gravity. Because the probability of successful placement is small (<<20%), a large amount of blocks are needed. Also, as the blocks get smaller, Brownian motion becomes more disruptive to precise placement and more time is required for settlement. Finally, if glass substrates are desired, then another problem is the efficient etching of precise-sized holes. Other rapid assembly techniques, like capillary self-assembly, still require fluid, which usually demands use of surfactants, and remain susceptible to Brownian motion.

SOITEC and other researchers have developed and refined a means of efficiently creating thin films of c-Si by ion-cutting with a high dose hydrogen implantation. In related work, Joly et al. have extended the ion-cutting process (Smart-Cut) to produce devices on one substrate, and transfer these devices to a different substrate. While their work describes a process for transferring the devices, there is little discussion regarding the impact of high dose hydrogen implantation on device performance. It is acknowledged by many that the required large doses of hydrogen (~5e$^{16}$ atoms/cm$^2$) can result in highly defective regions in the transferred silicon films.

FIG. 1 is a diagram of a hydrogen-induced cleaving process using a hydrogen blocking mask (prior art). To address some of the problems associated with the use of hydrogen, Bruel et al., describe the use of a blocking mask to protect active silicon regions from damage during the hydrogen implant. However, while blocking the channel areas during the hydrogen implant prevents damage, the subsequent transfer of the blocked regions (areas without H$^+$ implant) is problematic. It is difficult to cleave the active Si regions from the underlying Si substrate in any reliable or predictable manner. Therefore, this process has not proved to be practical for large-scale fabrication processes, or for the transfer of very large active Si areas, such as VLSI circuits with a plurality of blocked areas.

It would be advantageous if a process existed for placing partially completed VLSI crystalline silicon devices onto non-silicon substrates for the purpose of making large area devices, especially display systems, such as display matrices, complementary signal processes, and control circuitry.

It would be advantageous if the above-mentioned transfer process included the use of blocking masks to prevent damage to sensitive areas during H+ implant, while permitting those areas to be transferred to another substrate via wafer bonding and cleaving.

It would be advantageous if the heat load of above-mentioned transfer process could be accommodated by plastic substrates, including PET materials.

SUMMARY OF THE INVENTION

This application describes a process for partially, or completely fabricating single-crystalline devices on non-silicon, heat sensitive substrates. The method avoids the use of an intermediate substrate for the transfer of devices, and avoids the need for post-transfer thinning of active silicon layers. The process provides a means for transferring devices with more than 1 layer of metal. The process permits a blocking mask to be used, to prevent damage to active channel regions from H$^+$ implants. Further, the method permits high temperature processing to be completed on silicon substrates and then transferred to low temperature substrate such as glass or plastic.

Accordingly, a hydrogen (H) exfoliation method is provided for attaching silicon-on-insulator (SOI) fabricated circuits to carrier substrates. The method comprises: providing a SOI substrate, including a silicon (Si) active layer and buried oxide (BOX) layer overlying a Si substrate; forming a circuit in the Si active layer, such as a TFT; forming a blocking mask over selected circuit areas, such as the TFT gate; implanting H in the Si substrate; annealing; removing the blocking mask; depositing a top oxide layer overlying the circuit; planarizing the top oxide layer; in response to the H implanting, forming a cleaving plane in the Si substrate; bonding the circuit the top oxide layer to the carrier substrate; and, cleaving the Si substrate.

More specifically, forming a cleaving plane in the Si substrate includes forming a horizontal peak concentration (Rp) H layer in a mask non-underlying area in the Si substrate. Then, cleaving the Si substrate includes: cleaving a first region along the horizontal Rp layer in the mask non-underlying area in the Si substrate; cleaving a second region along a horizontal interface between the buried oxide layer and Si substrate; and, cleaving vertically between the first and second regions.

Using this process, the circuit in the Si active layer can be formed at process temperatures greater than some critical temperature, and the circuit can be subsequently bonded to a carrier substrate, such as glass or plastic, that is sensitive to temperatures greater than the critical temperature.

Additional details of the above-described method and an active Si layer cleaved from an SOI substrate are provided below.

BRIEF DESCRIPTION OF THE DRAWINGS

FIGS. 11 through 13 are plan and partial cross-sectional views providing some additional process details.

FIG. 14 is a flowchart illustrating a hydrogen (H) exfoliation method for attaching silicon-on-insulator (SOI) fabricated circuits to carrier substrates.

DETAILED DESCRIPTION OF THE PREFERRED EMBODIMENTS

Figure 1:
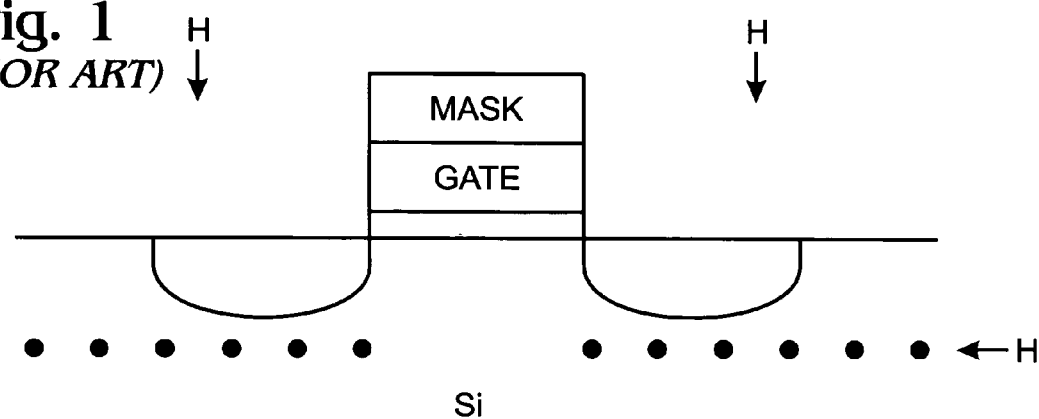
FIG. 1 is a diagram of a hydrogen-induced cleaving process using a hydrogen blocking mask (prior art).
Figure 2:
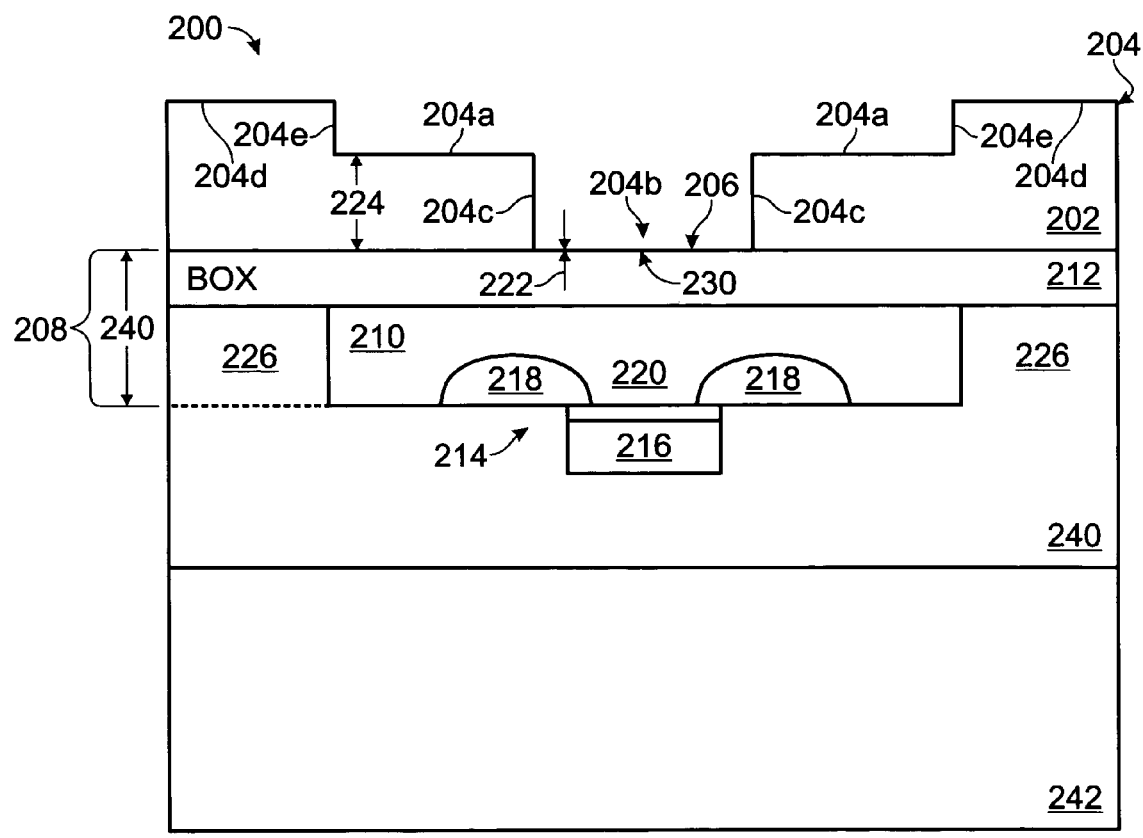
FIG. 2 is a partial cross-sectional view of an active silicon (Si) device cleaved from a silicon-on-insulator (SOI) substrate.

FIG. 2 is a partial cross-sectional view of an active silicon (Si) device cleaved from a silicon-on-insulator (SOI) substrate. The active Si device 200 comprises a Si substrate 202 with a cleaving plane surface 204 and a bottom surface 206. A SOI substrate 208, including a Si active layer 210 and buried oxide (BOX) layer 212 overlies the Si substrate bottom surface 206. A circuit 214 is formed in the Si active layer 210. The active layer 210 can be single-crystal or polycrystalline Si. In this case, the circuit 214 is a thin-film transistor with a gate 216, source/drain (S/D) areas 218, and a channel region 220 adjacent the S/D regions 218. With a TFT circuit 214, it is desirable that the hydrogen (H) used in the cleaving process be kept from diffusing into the channel region 220, as it degrades transistor electrical performance. Although a transistor circuit is shown as an example, the cleaved structure has application to any sensitive semiconductor region that must be kept hydrogen free. For example, the circuit 214 in the Si active layer 210 may also be CMOS circuits, VLSI devices, or a TFT integrated into CMOS or VLSI devices.

The Si substrate cleaving plane surface includes a first thickness surface 204a in areas underlying the Si active layer channel-adjacent areas, for example the S/D areas 218. A second thickness surface 204b, where the second thickness 222 is less than the first thickness 224, is formed in areas underlying the Si active layer channel region 220. Vertical plane surfaces 204c are formed between the areas of the first and second thickness surfaces 204a and 204b. Also shown is a third thickness surface 204d underlying the Si active layer field regions 226, adjacent the S/D areas 218. Vertical plane surfaces 204e are formed between the areas of the second and third thickness surfaces 204b and 204d. As shown, the second thickness 222 is approximately zero. That is, the second thickness surface 204b is formed on the surface 230 of the BOX. In other aspects, the second thickness 222 is in the range of 0 to 1000 Å. The first thickness 224 is in the range of 20 to 1000 nanometers (nm), depending on a variety of factors such as SOI thickness 240, dosage, implanting species, and implantation times.

As explained in greater detail below, a H-blocking mask temporarily overlies the SI active layer channel region 220, and more directly overlies the gate 216 (see FIG. 5). The blocking mask prevents the incorporation of H into the channel region 220 during the implantation process. Alternately stated, the Si substrate first thickness surface 204a includes a peak concentration of hydrogen (H), while the second thickness surface 204b includes a minimum concentration of H, typically none (zero), see FIG. 5. The Si substrate first thickness surface 204a peak concentration of hydrogen is in the range of $5\times10^{15}$ to $5\times10^{17}$.

In other aspects, the Si substrate first thickness surface 204a includes a peak concentration of an additional element such as boron He, Ne, Ar, or Si, while the second thickness surface 204b includes a minimum concentration of the additional element, typically none (zero). In the case of boron, the Si active layer first thickness surface 204a boron concentration is in the range of $5\times10^{12}$ to $5\times10^{14}$ at/cm$^2$. In the case of He, the Si substrate first thickness surface 204a includes a peak concentration of H at a dosage in the range of $2\times10^{16}$ at/cm$^2$ to $3\times10^{16}$ at/cm$^2$ and He at a dosage in the range of $1\times10^{16}$ at/cm$^2$ to $3\times10^{16}$ at/cm$^2$. Again, the second thickness surface 204b includes a minimum (typically zero) concentration of H and He.

A planarized oxide layer 240 overlies the active Si layer circuit 214. A carrier substrate 242, made from a material such as glass, plastic, quartz, and metal foil is bonded to the oxide layer 240. Alternately, the carrier substrate can be any semiconductor film or material that is sensitive to single crystal active circuit fabrication (high temperature) processes. After bonding and cleaving the carrier substrate 242, a planarization process is typically performed to remove the Si cleaving plane 204, down to the BOX surface 230. However, in some aspects the remaining Si is not removed.

Functional Description

Figure 3:
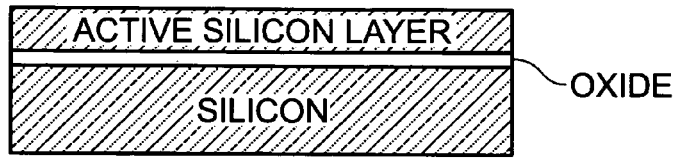
FIGS. 3 through 10 are partial cross-sectional views depicting steps in the fabrication of the active Si device of FIG. 2.
Figure 4:
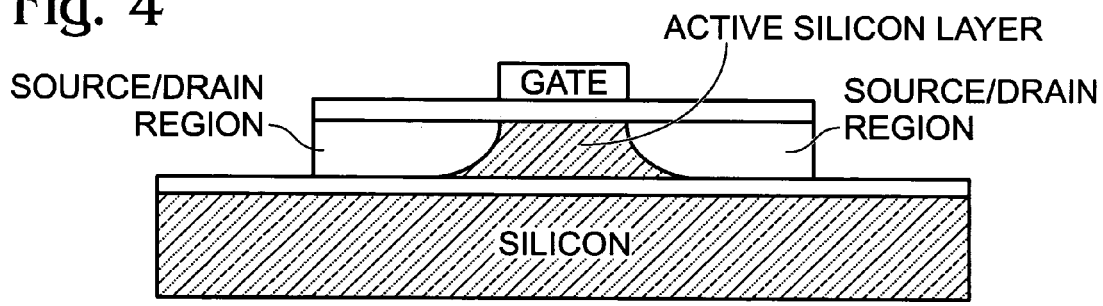
Figure 5:
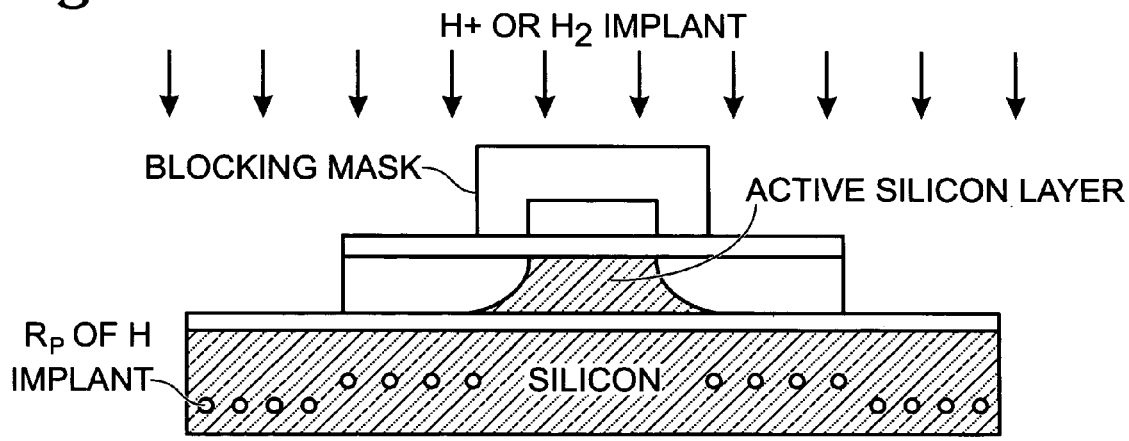
Figure 6:
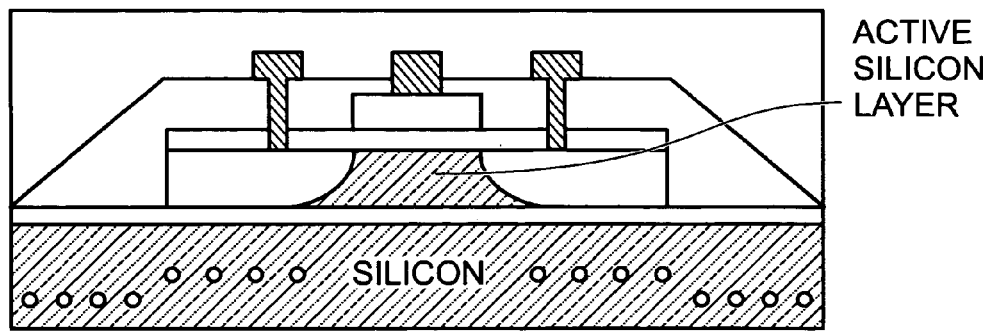

FIGS. 3 through 10 are partial cross-sectional views depicting steps in the fabrication of the active Si device of FIG. 2. In FIG. 3, the process begins with a SOI type wafer, including an active silicon layer of desired thickness and buried oxide layer of required thickness. In FIG. 4 the devices are fabricated in accordance to standard VLSI processing (i.e. CMOS, SOI, etc.) techniques. The conventional processes are stopped after activation of source/drain implants or a last high temperature step. In FIG. 5, a blocking mask is patterned to protect channel, and other regions, from hydrogen. Implantation is performed with H$^+$ or H$_2$ to place R$^p$ (a maximum concentration) of hydrogen within the handle silicon substrate. In FIG. 6, processing continues to complete the metal layers. Typically, the temperature of deposition and subsequent processing is kept less than the cleaving temperature of the H$^+$ implanted wafer. A smoothing oxide layer is deposited and planarized with either chemical-mechanical polishing (CMP) or by using spin-on-glass (SOG).

Figure 7:
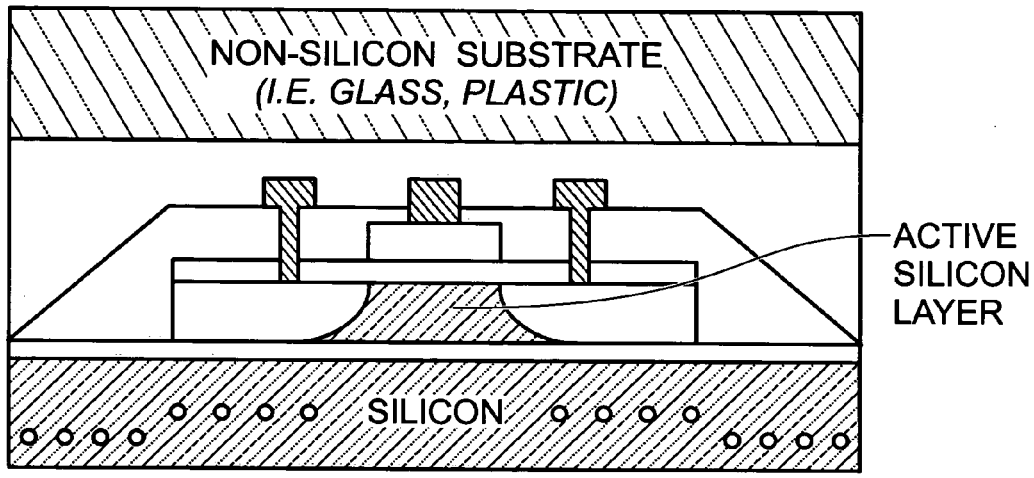
Figure 8:
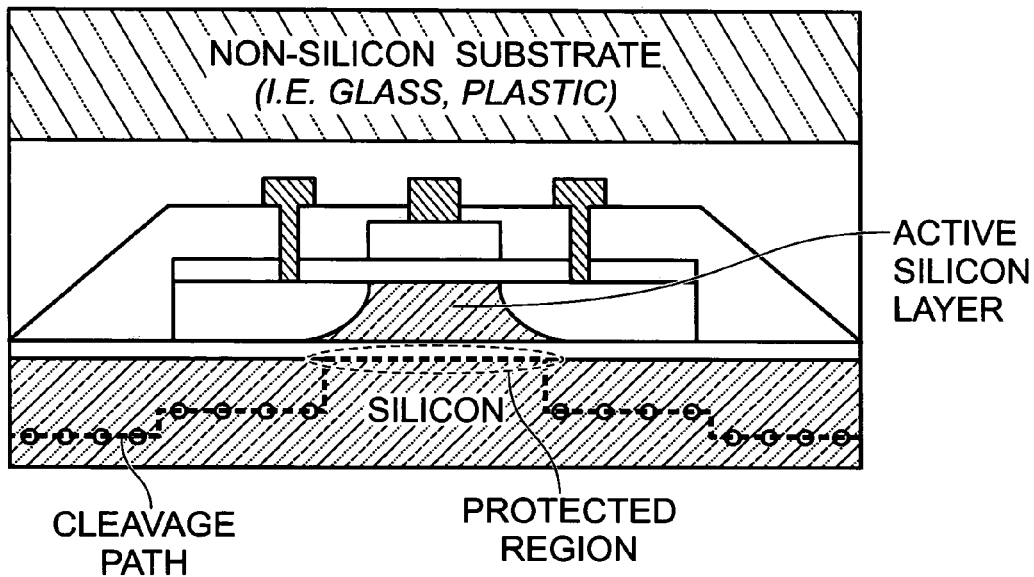
Figure 10:
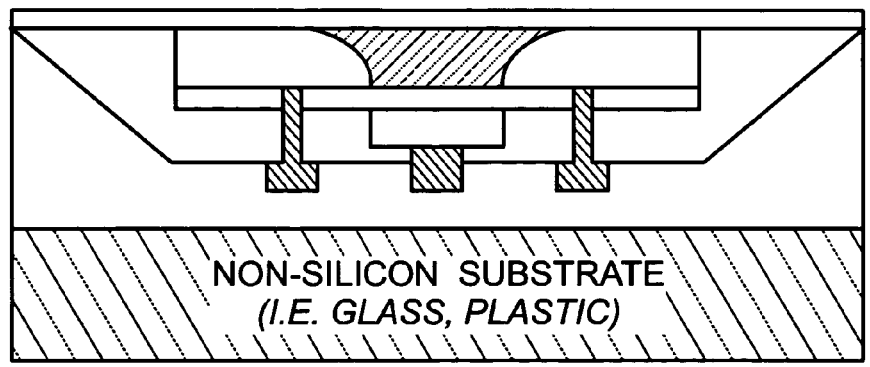
Figure 9:
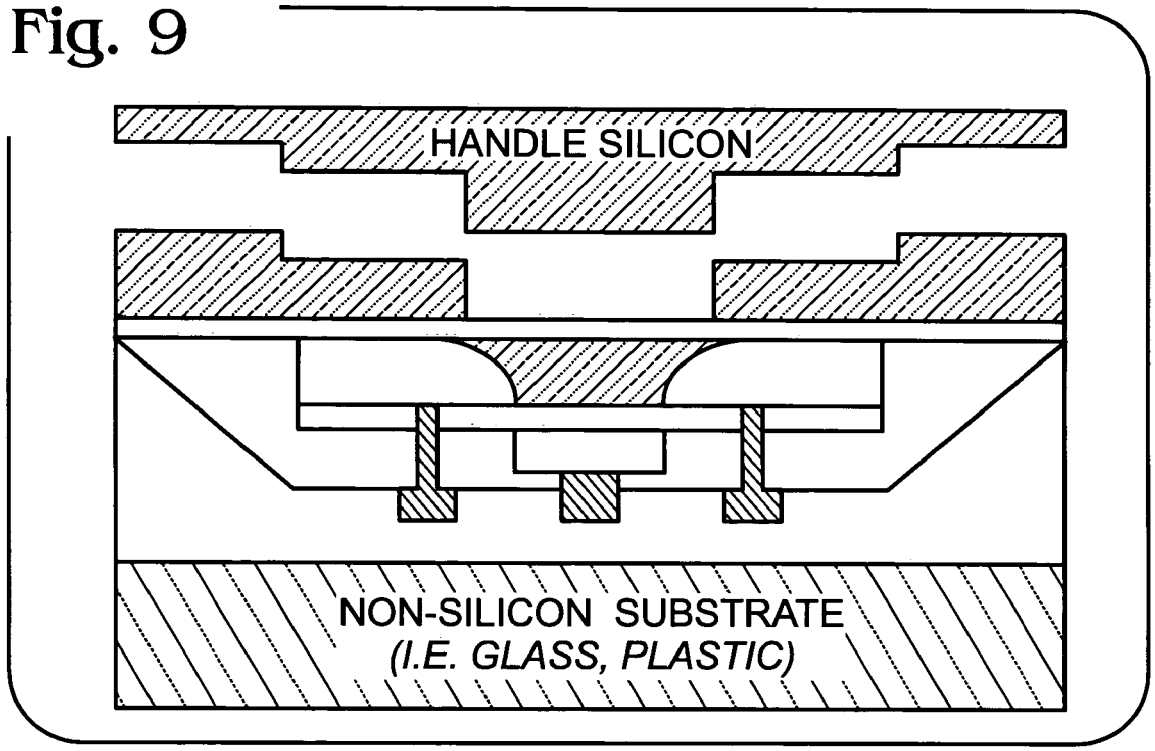

In FIG. 7, the bond wafer (or diced die) is attached to a non-silicon substrate. In FIG. 8, it can be seen that the implanted H+ establishes a cleaving plane at the R$^p$ location. When the bonded wafers (or die) are heated, cleaving results at the R$^p$ location. Where there is no H$^+$ implant (i.e. under the channel) the cleaving will propagate vertically until the buried oxide/silicon oxide layer is reached. Then, the cleaving will proceed laterally at the BOX interface. In FIG. 9, a high temperature annealing process is performed to cleave the handle silicon wafer. In FIG. 10, the remaining silicon is removed using standard reactive ion etch techniques, for example.

The above-described fabrication process uses silicon-on-insulator wafers implanted with H+. For example, this process permits thin film transistors to be fabricated on SIMOX substrates. Photoresist is patterned to block the channel areas of these devices from subsequent H+ implant according to the method described above. After H+ implant, TEOS oxide is deposited and planarized, and the SIMOX wafer (with the TFT's) is bonded to a glass substrate. The bonded pair is then heated to 600° C. to induce cleaving.

Figure 11:
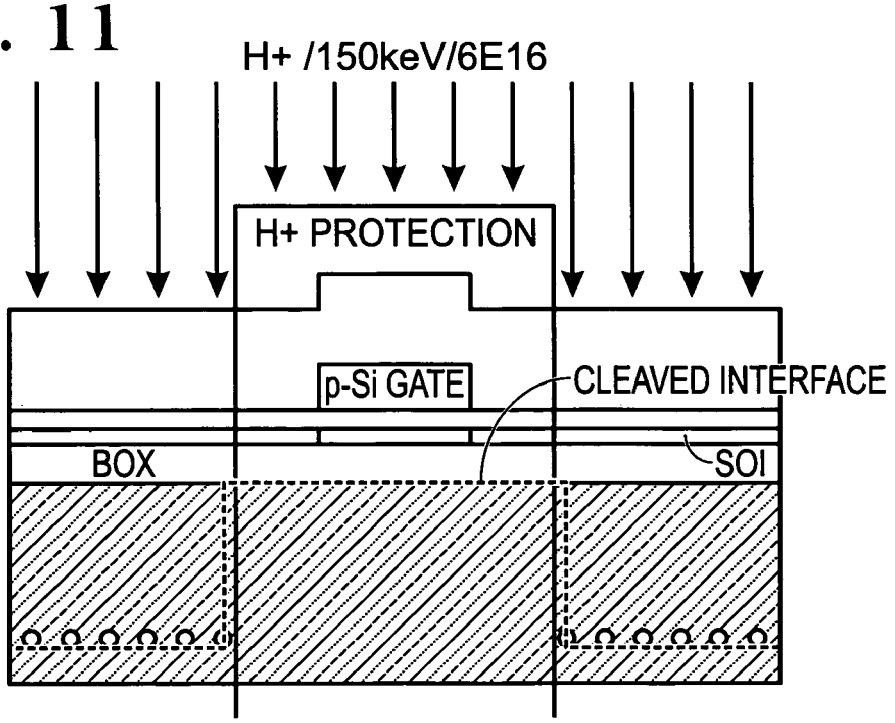

FIGS. 11 through 13 are plan and partial cross-sectional views providing some additional process details. In FIG. 11, H+ is implanted into a SOI wafer using a blocking mask to protect the channel area. The bonded pair (SOI substrate/ glass substrate) is heated to induce cleaving along H+ layer and buried oxide layer. FIG. 12 shows the cleaving profile, as measured via profilometry, after cleaving. The step height of the underlying silicon layer corresponds with that predicted by simulation (849 nm). In FIG. 13, the top transferred Si layer is etched to remove it. After removing the top silicon layer, the channel region and the buried device layer is now visible. There is a slight depression in the oxide layer due to the silicon etch step that also slightly etches oxide. Note that a silicon layer free of H+ implant damage is obtained, sandwiched by thermal oxide. The structure yields higher performance, as well as greater stability and reliability.

In other aspects (see FIG. 6), the fabrication of the devices can be stopped at gate metal deposition. Instead of producing the first layer of metal, the devices can be transferred to the non-silicon substrate with only the gate metal and source/drain activation completed.

In another variation, the implant step can include a boron implant to the same depth as the hydrogen implant. The addition of implanted boron can induce breakage at a much lower temperature, often 200° C. to 300° C., which allows a wider choice of substrates and metals. Other species can be co-implanted to improve the cleaving performance. These other species include He, Ne, Ar, or Si.

In a different aspect, the cleaving step need not be thermally induced. If the bonding strength is stronger than the required cleaving force, the cleaving could be induced by mechanical methods.

In another aspect, the etching process discussed in the explanation of FIG. 10 can be eliminated. Instead, the remaining silicon can be used as a protective layer for subsequent processing. More specifically, in the case of blanket laser crystallization, this silicon layer can act as a thermal sink to prevent dopant redistribution in the source/ drain regions during laser crystallization. The buried oxide layer of the original SOI material can be utilized as a basecoat material for subsequent polysilicon processing of hybrid circuits.

In one aspect, instead of using the buried oxide layer in the original SOI substrate, the SOI substrate can be fabricated in an alternative stack layer that allows for easier cleaving. For example, a porous Si layer can be used instead of SOI.

In a different aspect (see FIG. 9), the top silicon layer remaining on the BOX after cleaving can be used as an active device layer for subsequent device fabrication. This structure could be used for 3-D device integration. Further, the overall transfer process can be repeated (i.e. device fabrication on single crystal, then transfer to different substrate) to yield 3-D device integration.

FIG. 14 is a flowchart illustrating a hydrogen (H) exfoliation method for attaching silicon-on-insulator (SOI) fabricated circuits to carrier substrates. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 300.

Step 302 provides a SOI substrate, including a silicon (Si) active layer and buried oxide (BOX) layer overlying a Si substrate. Step 304 forms a circuit in the Si active layer. For example, TFTs, CMOS circuits, or VLSI devices may be formed. Step 306 forms a blocking mask over selected circuit areas. For example, the mask can be a photoresist material. Step 308 implants H in the Si substrate. Step 312 forms a cleaving plane in the Si substrate in response to the H implanting. Alternately stated, Step 306 forms a blocking mask over selected areas of the Si substrate, and Step 312 prevents the formation of H in the selected areas of the Si substrate, in response to the blocking mask. Step 314 bonds the circuit to a carrier substrate. Step 316 cleaves the Si substrate. In one aspect, Step 318 ion etches, following the cleaving of the Si substrate, and Step 320 removes any remaining Si substrate material.

In one aspect, forming a cleaving plane in the Si substrate in Step 312 includes forming a horizontal peak concentration (Rp) H layer in a mask non-underlying area in the Si substrate. Then, cleaving the Si substrate in Step 316 includes substeps. Step 316a cleaves a first region along the horizontal Rp layer in the mask non-underlying area in the Si substrate. Step 316b cleaves a second region along a horizontal interface between the buried oxide layer and Si substrate. Step 316c cleaves vertically between the first and second regions. The terms "horizontal" and "vertical" are relative and only used for convenience.

In one aspect, forming a circuit in the Si active layer (Step 304) includes forming a thin-film transistor (TFT). Then, forming the blocking mask over selected circuit areas in Step 306 includes forming the blocking mask overlying a TFT gate.

In a different aspect, Step 304 forms the circuit at process temperatures greater than a first temperature. Then, bonding the circuit to a carrier substrate in Step 314 includes bonding to a carrier substrate sensitive to temperatures greater than the first temperature. For example, the carrier substrate may be glass, plastic, quartz, metal foil, or a carrier fabricated with components sensitive to temperatures greater than the first temperature. In one aspect, Step 304 forms the circuit at a (first) temperature greater than 600 degrees C.

In one variation, implanting H in the Si substrate (Step 308) includes substeps (not shown). Step 308a implants H in a form such as H+ or H2. Step 308b implants (H) at a maximum energy of 1 MeV. Step 308c implants at a dosage in the range of $5 \times 10^{16}$ to $5 \times 10^{17}$.

In another aspect Step 309a (not shown), following the H implanting, removes the blocking mask. Step 309b (not shown) deposits a top oxide layer overlying the circuit. Step 309c (not shown) planarizes the top oxide layer. Then, bonding the circuit to a carrier substrate in Step 314 includes directly bonding the top oxide layer to the carrier substrate.

Typically, the method includes the additional step (Step 310) of annealing the Si substrate. Then, the Si substrate is cleaved (Step 316) in response to the annealing. In one aspect, the annealing temperature is in the range of 400 to 600 degrees C. In another aspect, Step 316 cleaves the Si substrate in response to a mechanical separation process. The mechanical separation process may additionally include the annealing step.

In another aspect, implanting H in the Si substrate (Step 308) may include additional implanting a species such as boron, He, Ne, Ar, or Si. For example, boron can be implanted at a dosage in the range of $5\times10^{12}$ to $5\times10^{14}$ at/cm$^2$. Then, Step 310 anneals the Si substrate at a temperature in the range of 200 to 300 degrees C. In another example, H is implanted at a dosage in the range of $2\times10^{16}$ at/cm$^2$ to $3\times10^{16}$ at/cm$^2$. In addition, He is implanted at a dosage in the range of $1\times10^{16}$ at/cm$^2$ to $3\times10^{16}$ at/cm$^2$.

A method for cleaving active Si circuitry from a Si substrate, for attachment to a temperature sensitive substrate, has been presented. Details of particular materials, temperatures, and implantation species have been provided to illustrate the invention. However, the invention is not limited to merely these examples. Other variations and embodiments of the invention will occur to those skilled in the art.

We claim:

1. A hydrogen (H) exfoliation method for attaching silicon-on-insulator (SOI) substrate fabricated circuits to carrier substrates, the method comprising:
   providing a SOI substrate, including a silicon (Si) active layer and buried oxide (BOX) layer overlying a Si substrate;
   forming a circuit in the Si active layer;
   forming a blocking mask over selected circuit areas;
   implanting H in the Si substrate;
   in response to the H implanting, forming a cleaving plane in the Si substrate;
   bonding the circuit to a carrier substrate;
   cleaving the Si substrate:
   wherein forming a cleaving plane in the Si substrate includes forming a horizontal peak concentration (Rp) H layer in a mask non-underlying area in the Si substrate; and,
   wherein cleaving the Si substrate includes:
      cleaving a first region along the horizontal Rp layer in the mask non-underlying area in the Si substrate;
      cleaving a second region along a horizontal interface between the buried oxide layer and Si substrate; and,
      cleaving vertically between the first and second regions.

2. The method of claim 1 wherein forming a circuit in the Si active layer includes forming a thin-film transistor (TFT); and,
   wherein forming a blocking mask over selected circuit areas includes forming the blocking mask overlying a TFT gate.

3. The method of claim 1 wherein forming a circuit in the Si active layer includes forming a circuit at process temperatures greater than a first temperature; and,
   wherein bonding the circuit to a carrier substrate includes bonding to a carrier substrate sensitive to temperatures greater than the first temperature.

4. The method of claim 3 wherein bonding to a carrier substrate sensitive to temperatures greater than the first temperature includes bonding to a carrier substrate selected from the group including glass, plastic, quartz, metal foil, and a carrier fabricated with components sensitive to temperatures greater than the first temperature.

5. The method of claim 4 wherein forming a circuit at process temperatures greater than a first temperature includes forming a circuit at a temperature greater than 600 degrees C.

6. The method of claim 1 wherein implanting H in the Si substrate includes:
   implanting H in a form selected from the group including H+ and H2;
   implanting at a maximum energy of 1 MeV; and
   implanting at a dosage in the range of $5\times10^{15}$ to $5\times10^{17}$.

7. The method of claim 1 further comprising:
   following the H implanting, removing the blocking mask;
   depositing a top oxide layer overlying the circuit;
   planarizing the top oxide layer; and
   wherein bonding the circuit to a carrier substrate includes directly bonding the top oxide layer to the carrier substrate.

8. The method of claim 1 further comprising:
   annealing the Si substrate; and,
   wherein cleaving the Si substrate includes cleaving in response to the annealing.

9. The method of claim 8 wherein annealing the Si substrate includes annealing at a temperature in the range of 400 to 600 degrees C.

10. The method of claim 8 wherein implanting H in the Si substrate additionally includes implanting boron at a dosage in the range of $5\times10^{12}$ to $5\times10^{14}$ at/cm$^2$; and,
    wherein annealing the Si substrate includes annealing at a temperature in the range of 200 to 300 degrees C.

11. The method of claim 1 wherein cleaving the Si substrate includes cleaving in response to a mechanical separation process.

12. The method of claim 1 wherein forming a blocking mask over selected circuit areas includes forming a mask from a photoresist material.

13. The method of claim 1 wherein implanting H in the Si substrate additionally includes implanting a species selected from the group including boron, He, Ne, Ar, and Si.

14. The method of claim 1 further comprising:
    following the cleaving of the Si substrate, ion etching; and, removing any remaining Si substrate material.

15. The method of claim 1 wherein forming a circuit in the Si active layer includes forming a circuit selected from the group including TFTs, CMOS circuits, and VLSI devices.

16. The method of claim 1 wherein implanting H in the Si substrate includes:
    implanting H at a dosage in the range of $2\times10^{16}$ at/cm$^2$ to $3\times10^{16}$ at/cm$^2$; and,
    additionally implanting He at a dosage in the range of $1\times10^{16}$ at/cm$^2$ to $3\times10^{16}$ at/cm$^2$.

17. The method of claim 1 wherein forming a blocking mask over selected circuit areas includes forming a blocking mask over selected areas of the Si substrate; and,
    the method further comprising:
    in response to the blocking mask, preventing the formation of H in the selected areas of the Si substrate.

* * * * *